(12) United States Patent
Schmidt

(10) Patent No.: US 9,130,336 B2
(45) Date of Patent: Sep. 8, 2015

(54) ARRANGEMENT OF OPTICAL SEMICONDUCTOR ELEMENTS

(71) Applicant: Ingo Schmidt, Zeuthen (DE)

(72) Inventor: Ingo Schmidt, Zeuthen (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/952,248

(22) Filed: Jul. 26, 2013

(65) Prior Publication Data

US 2014/0029637 A1    Jan. 30, 2014

(30) Foreign Application Priority Data

Jul. 26, 2012   (DE) .......................... 10 2012 213 193

(51) Int. Cl.

| H01L 23/64 | (2006.01) |
| H01L 31/0232 | (2014.01) |
| H01S 5/024 | (2006.01) |
| H01L 33/64 | (2010.01) |
| H01S 5/022 | (2006.01) |
| H01S 5/40 | (2006.01) |
| H01S 5/00 | (2006.01) |
| H01S 5/02 | (2006.01) |

(52) U.S. Cl.
CPC ............ *H01S 5/024* (2013.01); *H01L 31/0232* (2013.01); *H01L 33/64* (2013.01); *H01S 5/02212* (2013.01); *H01S 5/4025* (2013.01); *H01S 5/005* (2013.01); *H01S 5/0071* (2013.01); *H01S 5/02* (2013.01)

(58) Field of Classification Search
CPC ............................ H01L 31/0232; H01L 33/64
USPC .......................................... 257/678; 359/813
See application file for complete search history.

(56) References Cited

U.S. PATENT DOCUMENTS 5,973,862 A    10/1999 Hashizume
7,092,174 B2 *  8/2006 Yamaguchi et al. .......... 359/819

FOREIGN PATENT DOCUMENTS

| DE | 31 42 630 | 5/1982 |
| DE | 103 44 768 | 8/2005 |
| DE | 10 2006 008 230 | 8/2007 |
| DE | 102006008230 | * 8/2007 |
| DE | 10 2009 056 659 | 6/2011 |
| DE | 10 2011 078 519 | 5/2012 |
| GB | 2 087 591 | 5/1982 |
| JP | 2009-151128 | 7/2009 |
| JP | 2011-128424 | 6/2011 |
| JP | 2011-128484 | 6/2011 |

OTHER PUBLICATIONS

English Machine Translation of German Publication DE 102006008230. Translation done on Nov. 15, 2014.*

* cited by examiner

*Primary Examiner* — Amar Movva
(74) *Attorney, Agent, or Firm* — Cozen O'Connor

(57) ABSTRACT

An arrangement with a multiplicity of optical semiconductor elements is disclosed. The semiconductor elements are respectively clamped against a semiconductor element carrier by way of a spring element. Additionally lying against the spring element is an optical element assigned to a respective semiconductor element, the spring element in this case being configured in such a way that it defines a fixed distance between the semiconductor element and the optical element.

12 Claims, 4 Drawing Sheets

ARRANGEMENT OF OPTICAL SEMICONDUCTOR ELEMENTS

RELATED APPLICATION

This application claims the priority of German application no. 10 2012 213 193.0 filed Jul. 26, 2012, and its subject matter is hereby incorporated herein by reference.

FIELD OF THE INVENTION

The invention is related to an arrangement with at least one optical semiconductor element, in particular a light-emitting diode (LED, IRED or UV-LED) or laser diode, according to the preamble of claim 1.

BACKGROUND OF THE INVENTION

Arrangements with optical semiconductor elements, such as for example light-emitting diodes and laser diodes, require effective heat management, since the light generation or the efficiency of the radiation generation depends greatly on the temperature, to be specific such that higher operating temperatures result in lower efficiency. It is therefore important, for example, to keep what is known as the junction temperature as low as possible. For this purpose, the semiconductor element is usually connected to heat sinks for establishing a heat-conducting contact.

An arrangement with semiconductor elements may be, for example, a laser-array projector. Such projectors have a multiplicity of laser diodes arranged in one plane in the manner of an array. A respective laser diode has in this case a housing, which has a heat sink in the form of a substantially circular-cylindrical plate, on the upper side of which a cup-shaped cap—the diameter of which is smaller than the diameter of the heat sink—is arranged and on the underside of which contact pins are arranged. The cup-shaped cap has in its bottom a through-opening, through which the radiation emitted by the laser diode can pass. The heat sink in plate form of the housing of the laser diode is inserted flush in a blind-hole bore of a semiconductor element carrier in plate form, a depth of the heat sink in plate form of the housing corresponding approximately to a depth of the blind-hole bore of the semiconductor element carrier. For securing the laser diodes, the semiconductor element carrier is then connected in a sandwich-like manner to a perforated plate, which for each laser diode has a through-bore, which in each case has a smaller diameter than a respective blind-hole bore of the semiconductor element carrier and into which the cup-shaped caps of the laser diodes fit. As a result of the small diameter of its through-bores, the perforated plate then partly covers over the blind-hole bores, whereby the laser diodes are firmly secured by way of their heat sink in plate form between the semiconductor element carrier and the perforated plate. Production tolerances of the installed elements may mean that a heat outflow from the heat sink of a respective laser diode to the semiconductor element carrier or to the perforated plate is disadvantageously extremely low, since there is often scarcely any heat-conducting contact.

Furthermore, the laser-array projector explained above may additionally have a lens carrier plate, which is firmly connected in a sandwich-like manner to the perforated plate, and consequently the perforated plate is provided between the lens carrier plate and the semiconductor element carrier in plate form. The lens carrier plate generally has for each laser diode a through-opening, into which one or more optical elements, such as for example lenses, are inserted. In this case, the tolerance of the installed elements has an effect on the position, in particular the distance, of the optical elements in relation to the laser diode, which leads for example to the projector having losses of definition in its imaging plane during use.

SUMMARY OF THE INVENTION

One object of the present invention is to provide an arrangement with at least one optical semiconductor element, the lost heat of which is effectively dissipated and which has a high level of optical quality.

This and other objects are attained in accordance with one aspect of the present invention directed to an arrangement with at least one optical semiconductor element, which has a semiconductor housing fixed on a semiconductor element carrier. The semiconductor housing is supported on the semiconductor element carrier and, for fixing, is loaded by way of a spring element with a spring force in the direction of the semiconductor element carrier. An optical element that is assigned to the semiconductor element is in operative connection with the spring element, and the spring element is configured in such a way that it fixes a distance between the optical element and the semiconductor element.

According to an embodiment of the invention, an arrangement with at least one optical semiconductor element, which is in particular a light-emitting diode or laser diode, is provided and has a semiconductor housing fixed on a semiconductor element carrier, in particular in plate form. The semiconductor housing lies indirectly or directly against the semiconductor element carrier and is supported on it. For fixing the semiconductor housing to the semiconductor element carrier, in particular substantially in a radiating direction of a radiation emitted by the semiconductor element, a spring element which loads the semiconductor housing with a spring force in the direction of the semiconductor element carrier is provided. Lying indirectly or directly against the spring element is an optical element assigned to the semiconductor element. The spring element is advantageously configured here in such a way that it defines a fixed distance between the optical element and the semiconductor element or the semiconductor element housing.

This solution has the advantage that on the one hand the semiconductor element lies with its semiconductor housing firmly and flatly against the semiconductor element carrier as a result of the loading with a spring force, whereby there is an effective heat-conducting contact, in order to optimally dissipate lost heat. Furthermore, the spring element advantageously has a dual function, that is that, apart from loading the semiconductor element with a spring force, it is additionally configured in such a way that a distance between the semiconductor element and the optical element remains the same. Consequently, the semiconductor element and the optical element arranged downstream of it are arranged in a constant position in relation to one another.

The spring element, configured in particular in one piece, has, for example, a substantially mechanically stiff element portion, which as a spacer fixes the distance between the semiconductor element and the optical element, and a resilient element portion, with which the semiconductor housing is loaded with the spring force by way of the mechanically stiff element portion. With such a configuration, the dual function of the spring element can be implemented in a simple and low-cost way.

In a further configuration of the invention, the arrangement has a multiplicity of semiconductor elements arranged in particular in the manner of a matrix or in the manner of an array. In this case, one or more or all of the semiconductor elements is or are advantageously assigned a respective optical element. For securing the optical elements in a simple way, an element carrier connected to the semiconductor element carrier may then preferably be provided, it being possible for the carriers to be configured in each case in plate form and connected to one another in a sandwich-like manner.

For loading the semiconductor housing with a spring force of the spring element, it may simply be supported on the element carrier.

The spring element is advantageously formed in a low-cost and simple manner as a spring sleeve, which can partly enclose the semiconductor housing. The spring sleeve has in particular two end faces, it being possible for it to lie with its one end face partly against the semiconductor housing and it then being possible for the assigned optical element to be brought to lie at least partly against the other end face. Furthermore, the spring sleeve has a radially outwardly extending, in particular annular, spring projection, which is supported on the element carrier, in particular on a supporting surface of the element carrier that is facing the semiconductor element carrier, and the semiconductor housing being loaded with the spring force. The sleeve-like configuration of the spring element allows a radiation that is emitted by the semiconductor element to pass through it substantially uninfluenced. The spring sleeve is consequently preferably arranged approximately coaxially in relation to the radiating direction of the emitted radiation of the semiconductor element.

In a further configuration of the invention, the semiconductor element carrier has for receiving the semiconductor element and the spring sleeve a clearance, in particular a circular-cylindrical clearance. This clearance is open in the direction of the element carrier and is partly covered over by the element carrier with a supporting surface, on which the spring element can be supported by way of the spring projection.

With particular preference, the element carrier has for receiving a respective optical element, in particular a lens, a through-opening, in particular a circular-cylindrical through-opening, whereby the element carrier is consequently configured in the manner of a perforated plate. The axial length of the spring sleeve has the effect of setting the distance between the semiconductor element and the optical element assigned to it. If the arrangement has a multiplicity of semiconductor elements, they may be at different distances from their assigned optical elements, simply by using spring sleeves with different axial lengths.

In order that a respective optical element is safely secured and longitudinal extensions of the elements of the arrangement according to the invention can be compensated, a further spring element is provided, by way of which the optical element is loaded with a spring force in the direction of the spring sleeve.

The further spring element may be formed at low cost as a spring plate, which in the manner of a perforated plate has for a respective optical element a through-opening which extends around said element. Into a respective through-opening there then protrudes at least one spring projection, which is formed in particular as a lug and then acts on the optical element. A multiplicity of spring projections are preferably provided in the case of a respective through-opening and are arranged for example on a pitch circle.

The spring plate is preferably secured between the element carrier and a pressure-exerting plate, which is arranged on a large side of the element carrier that is facing away from the semiconductor element, is configured in particular in the manner of a perforated plate and has for each semiconductor element a through-opening, for allowing radiation emitted by the respective semiconductor element to pass through.

BRIEF DESCRIPTION OF THE DRAWINGS

The invention is to be explained in more detail below on the basis of exemplary embodiments. In the figures.

DETAILED DESCRIPTION OF THE DRAWINGS

Figure 1:
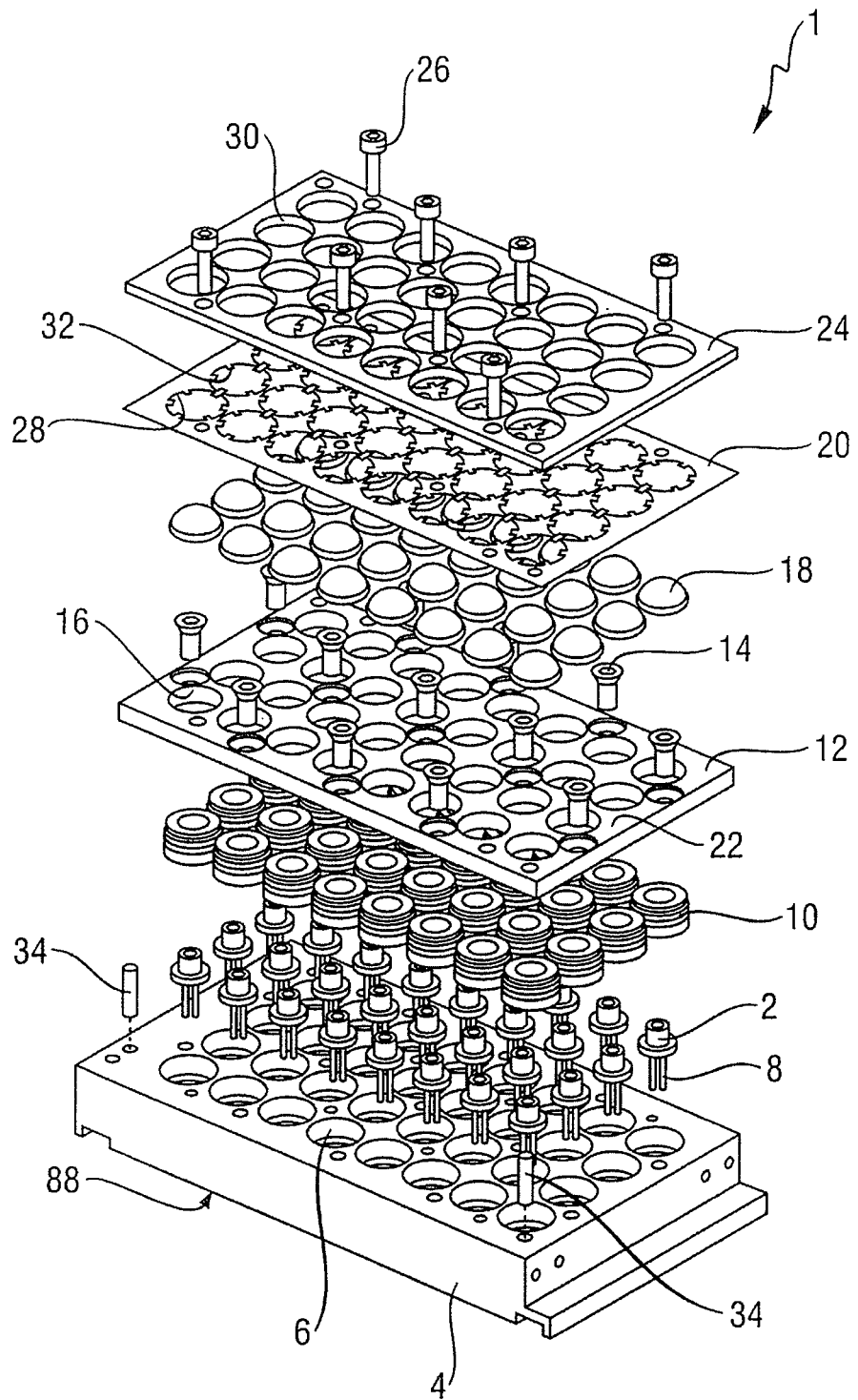
FIG. 1 shows the arrangement according to the invention as provided by an exemplary embodiment in an exploded representation.

According to FIG. 1, an arrangement 1 with a multiplicity of optical semiconductor elements arranged in the manner of a matrix in the form of laser diodes 2 is represented. Such an arrangement 1 with the laser diodes 2 is used, for example, as a laser-array projector. In FIG. 1, for the sake of clarity only one laser diode 2 is provided with a reference sign, though in the embodiment a total of thirty-two laser diodes 2 are provided. These are arranged in four columns, provided spaced apart in parallel, with 8 laser diodes 2 in each. The laser diodes 2 consequently form an approximately rectangular array.

For carrying the laser diodes 2, a semiconductor element carrier 4 is provided and has for each laser diode 2 a clearance 6 in the form of a blind hole, in which the laser diodes 2 are inserted with their contact pins 8.

For fixing the laser diodes 2 in the semiconductor element carrier 4, a spring element in the form of a spring sleeve 10 is provided for each laser diode 2. A respective spring sleeve 10 is likewise inserted partly into a respective clearance 6 of the semiconductor element carrier 4, which is explained in more detail below in FIG. 2. The spring sleeve 10 is arranged approximately coaxially in relation to the laser diode 2 and extends around it.

Screwed to the semiconductor element carrier 4 in plate form, by way of a multiplicity of countersunk screws 14, is an element carrier 12 in the form of a perforated plate. The element carrier 12 has for each laser diode 2 a through-bore 16. In the screwed state, through-bores 16 are arranged approximately coaxially in relation to the spring sleeve 10, in relation to the laser diode 2 and in relation to the clearance of the semiconductor carrier 4. In the screwed state, a spring sleeve 10 in each case protrudes partly into a respective through-bore 16, which is likewise explained in more detail below in FIG. 2.

Inserted in a respective through-bore 16 is an optical element in the form of a lens 18, which is, for example, a collimator lens. A respective lens 18 is in this case supported radially on an inner wall of a respective through-bore 16 and axially on the spring sleeve 10. For securing the lenses 18, a spring plate 20 is provided and lies on the element carrier 12 with its large side 22 facing away from the semiconductor element carrier 4. The spring plate 20 is fastened to the element carrier 12 by way of a pressure-exerting plate 24 in the form of a perforated plate, which is arranged on the spring plate 20 and is firmly connected to the semiconductor element carrier 4 by way of screws 26. Both the spring plate 20 and the pressure-exerting plate 24 have in a way corresponding to the element carrier 12 a clearance 28 and 30 for each laser diode 2, in order that a radiation emitted by the laser diodes 2 can pass through them. In a respective clearance 28 of the spring plate there protrude a multiplicity of spring projections 32, which are formed as lugs, in the mounted state lie against a respective lens 18 and load the latter with a spring force in the direction of the spring sleeve 10 assigned to the respective lens 18. A respective lens 18 is consequently firmly secured between the spring sleeve 10 and the spring plate 20, any stresses occurring, for example in the case of longitudinal extensions, being compensated by the spring projections 32.

By way of two centering pins 34, the semiconductor element carrier 4, the element carrier 12, the spring plate 20 and the pressure-exerting plate 24 are centered in relation to one another.

A description of the construction of the arrangement 1 in the screwed state is given below on the basis of FIG. 2. The clearance 6 in the form of a blind hole of the semiconductor element carrier 4 is configured in a stepped form, with a first bore step 38, having a smaller diameter, and a second bore step 40, having a greater diameter. The clearance 6 is adjoined by three through-bores, which extend from the lower bore step 38, having a smaller diameter, and two of which can be seen in FIG. 2 and are provided with the reference signs 42 and 44. The contact pins 8 of the laser diode 2 are inserted into the through-bores 42, 44.

The laser diode 2 is a conventional laser diode 2, for which reason only the elements that are essential to the invention are explained below. The laser diode 2 has a semiconductor housing 46 with an approximately circular-cylindrical heat sink 48 in plate form, from the underside of which the contact pins extend away approximately in the form of a perpendicular line. Provided on an upper side 50 of the heat sink 46 is a cup-shaped cap 52, within which a laser diode emitting radiation is arranged, which is not shown in FIG. 2. A housing bottom of the cup-shaped cap 52 has an opening 54, through which radiation emitted by the laser diode 2 can emerge in a direction away from the semiconductor element carrier 4.

The laser diode 2 is inserted with its heat sink 48 flush in the first bore step 38 of the clearance 6 of the semiconductor element carrier 4, a depth of the heat sink 48 being greater than a depth of the bore step 38. The heat sink 48 consequently protrudes slightly out of the bore step 48 and into the bore step 40.

For fixing the laser diode 2 with its semiconductor housing 46 on the semiconductor element carrier 4, the spring sleeve 10 is provided. This has an inside diameter that is greater than an outside diameter of the cap 52 and smaller than an outside diameter of the heat sink 48, whereby the spring sleeve 10 can be brought to lie with its annular end face 56 against the upper side 50 of the heat sink 48. From its end face 56, the spring sleeve 10 has an outwardly extending radial collar 58, the outside diameter of which approximately corresponds substantially to the inside diameter of the bore step 40, having the greater diameter, of the clearance 6, whereby, in the inserted state the spring sleeve 10 is arranged flush in the bore step 40. A depth of the radial collar 58 is smaller than a depth of the bore step 40, whereby said collar is completely fitted within the bore step 40. From its end face 56, the spring sleeve 10 is beveled with an outer bevel 60, whereby it can be inserted more easily into the clearance 6 during assembly. At a distance axially from the radial collar 58 in a direction away from the semiconductor element carrier 4 there is formed on the spring sleeve 10 an annular spring projection 62, extending radially away in the outward direction. This projection is configured in this case in such a way that, in the non-assembled state of the element carrier 12, it is arranged with one portion within the bore step 40 and with the remaining portion outside the bore step 40, as seen in the axial direction. As a result, the spring projection 62 is bent in the direction of the radial collar 58 during the assembly of the element carrier 12, whereby a spring force acts on the semiconductor housing 46 of the laser diode 2. According to the representation in FIG. 2, the spring projection 62 is schematically represented in a state in which it is not bent by the element carrier 12. The through-bore 16 of the element carrier 12 has a smaller diameter than the upper bore step 40 of the clearance 6 of the semiconductor element carrier 4, whereby the element carrier 12 extends partly over the clearance 6 with an annular supporting surface 64. By way of this supporting surface 64 of the element carrier 12, the spring projection 62 is bent in the direction of the radial collar 58.

An outside diameter of the spring projection 62 is greater than an inside diameter of the through-bore 16 of the element carrier 12 and slightly smaller than an outside diameter of the radial collar 58.

At a distance axially from the spring projection 62 in a direction away from the semiconductor element carrier 4 there is formed on the spring sleeve 10 a further radial collar 66. The outside diameter thereof corresponds approximately to the inside diameter of the through-bore 16 of the element carrier 12, and consequently is fitted substantially flush in the through-bore 16 of the element carrier 12. An axial length of the spring sleeve 10 is chosen such that it extends approximately midway into the through-bore 16 of the element carrier 12, as seen in the axial direction. From an end face 68 of the spring sleeve 10, which faces away from the other end face 56, there is formed a blind-hole bore 70, the depth of which corresponds approximately to half the depth of the radial collar 66, the radial collar 66 likewise extending from the end face 68. The blind-hole bore 70 is adjoined by a frustoconical inner lateral surface 72, which together with the blind-hole bore 70 has a smaller depth than the radial collar 66. The inner lateral surface 72 then goes over into an approximately circular-cylindrical inner lateral surface 74, which ends at the lower end face 56 of the spring sleeve 10.

The lens 18 is partly inserted in the element carrier 12, in the through-bore 16 thereof. This lens has an outer lateral surface 76, which has an approximately circular-cylindrical cross section and the outside diameter of which corresponds approximately to the inside diameter of the through-bore 16 of the element carrier 12. An underside 78 of the lens 18 is configured convexly in the form of a dome and lies against an inner edge 80 of the spring sleeve 10. The annular inner edge is the transition between the end face 68, extending approximately transversely in relation to the axial direction, and the blind-hole bore 70. The lens 18 consequently extends partly into the blind-hole bore 70 of the spring sleeve 10. An upper side 82 of the lens 18 is likewise configured convexly in the form of a dome and has a greater curvature than the underside 78. The upper side 82 is arranged substantially outside the through-bore 16 of the element carrier 12.

Since the laser diode 2 lies with its semiconductor housing 46 against the lower end face 56 of the spring sleeve 10 and the lens 18 lies against the inner edge 80 of the upper end face 68 of the spring sleeve 10, the distance between them is predetermined by an axial length of the spring sleeve 10 or a distance between the inner edge 80 and the lower end face 56. The spring sleeve consequently performs two functions, that is on the one hand it clamps the laser diode 2 against the element carrier 12 and on the other hand it defines the distance between the lens 18 and the laser diode 2.

In order that the lens 18 is firmly secured in the through-bore 16 of the element carrier 12, the spring plate 20 is provided. A diameter of the clearance 28 of the spring plate 20 is in this case chosen such that the lens 18 does not lie against the inner wall of the clearance 28, but against the spring projections 32, see FIG. 1. These projections protrude from the inner wall of the clearance 28 approximately radially out toward the lens 18 and act on the upper side 82 thereof. As explained above in FIG. 1, the spring plate 20 is arranged between the element carrier 12 and the pressure-exerting plate 24. An inside diameter of the clearance 30 of the pressure-exerting plate 24 corresponds approximately to the inside diameter of the bore step 40 of the clearance 6 of the semiconductor element carrier 4. The lens 18 passes completely through both the clearance 28 of the spring plate 20 and the clearance 30 of the pressure-exerting plate 24 and protrudes out from the latter.

Figure 4:
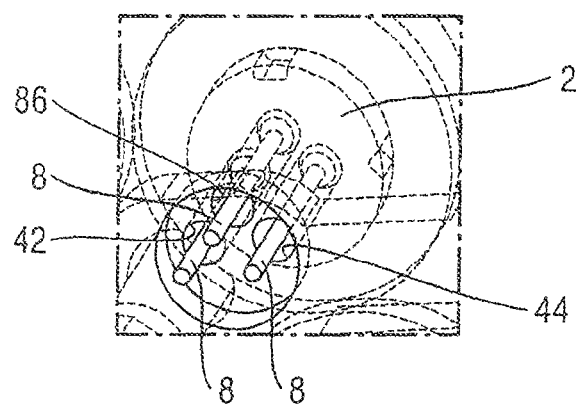
FIG. 4 shows a detail of the arrangement from FIG. 1 in the region of the semiconductor element in a perspective view from below.

The operation of assembling the arrangement 1 is explained below on the basis of FIGS. 1 and 2. In a first assembly step, the laser diodes 2 are provided on their underside 84, see FIG. 2, with a heat-conducting paste. Following this, they are placed in the clearances 6 of the semiconductor element carrier 4. According to FIG. 4, a positional fixing of the laser diodes 2 takes place in this case by the three contact pins, which are arranged in the form of a triangle in relation to one another and respectively sink into the through-bore 42, 44 or 86. A contact pin 8 serves in this case as a chassis ground. After the laser diodes 2, the spring sleeves 10 are inserted into the clearances 6 of the semiconductor element carrier 4 and then the element carrier 12 is placed onto the semiconductor element carrier 4. The element carrier 12 is then pre-adjusted with the semiconductor element carrier 4 by slightly tightening the countersunk screws 14. Subsequently, the carriers 4 and 12 are pressed together, a pressing force of approximately 800 N being used. After the pressing together, the countersunk screws 14 are tightened, with their screw heads completely sunken into the element carrier 12. In a next method step, from the underside 88 of the semiconductor element carrier 4, facing away from the element carrier 12, see FIG. 1, a printed circuit board that is not represented and is intended for the contacting of the laser diodes 2 is inserted and soldered to said diodes.

In a next method step, the lenses 18 are inserted into the element carrier 12, after which the spring plate 20 and the other plate 24 are arranged on the element carrier 12 and screwed to the semiconductor element carrier 4 by way of the screws 26.

Figure 3:
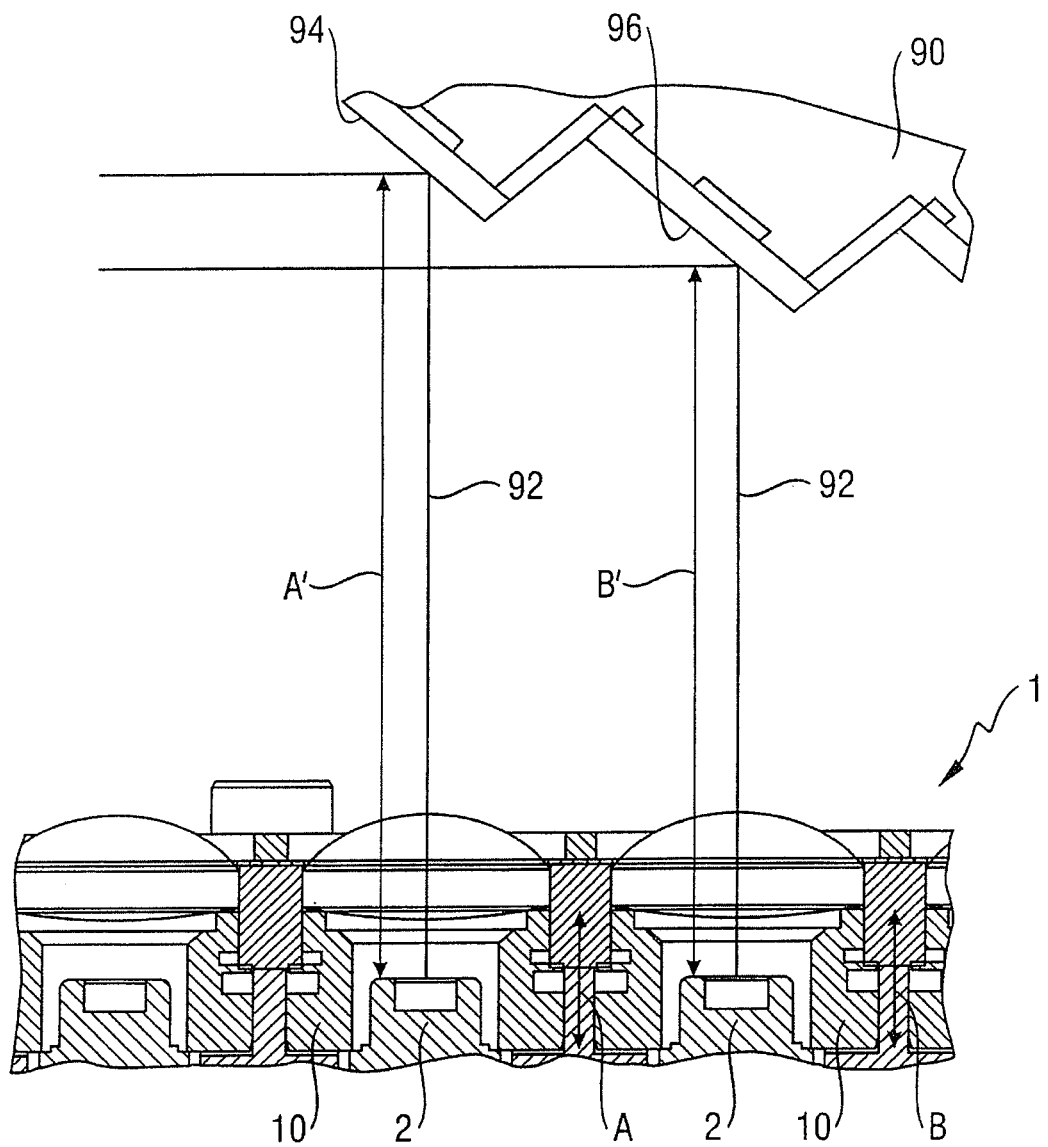
FIG. 3 shows a detail of the arrangement from FIG. 1, together with a detail of a stepped reflector, in a longitudinal section.

According to FIG. 3, the arrangement 1 is represented with a stepped reflector 90. This is what is known as a compression arrangement. The stepped reflector 90 is shown by way of example in FIG. 3. With the stepped reflector 90, a radiation 92 emitted by the laser diodes 2 is deflected by approximately 90°. For this purpose, reflectors 94 and 96 arranged in a stepped form are provided, the reflector 94 on the left in FIG. 3 being at a greater distance from the laser diode 2 assigned to it than the reflector 96 on the right. As a result, a beam path length A' between the reflector 94 on the left and the laser diode 2 assigned to it differs from the beam path length B' between the reflector 96 on the right and the laser diode 2 assigned to it. The different beam path lengths A' and B' lead to a difference in representation in an imaging plane that is not represented in FIG. 3. In order to compensate for the difference in representation, the spring sleeve 10 of the laser diode 2 assigned to the reflector 94 has a different axial length A than the spring sleeve 10 of the other laser diode 2 with the axial length B.

By specific changing of the axial length of the spring sleeves 10 of the arrangement 1 from FIG. 1, it is conceivable to generate projections of images that are conducive to the application, such as for example to change the distribution of the intensity at the application site.

Consequently, when using compression steps, a beam path length can be compensated by the spring sleeves 10 and/or the imaging plane can be deliberately influenced.

Figure 5:
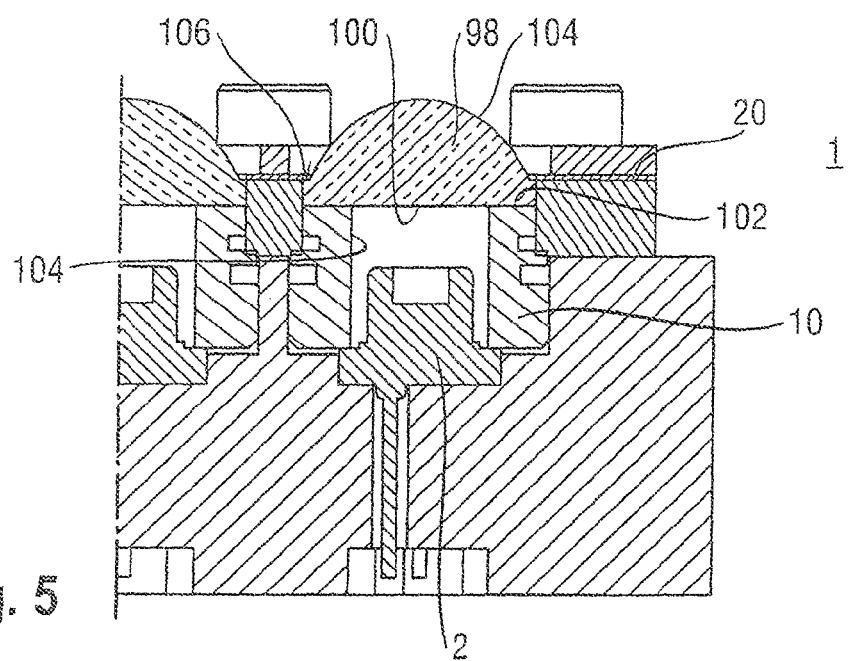
FIG. 5 shows a detail of an arrangement as provided by a second exemplary embodiment in a longitudinal section.

According to FIG. 5, an arrangement 1 with laser diodes 2 in which the lens 98 has a different configuration is represented. This lens has an underside 100, which extends substantially transversely in relation to the longitudinal axis and lies against an end face 102 of the spring sleeve 10. As a difference from the previous exemplary embodiment, the spring sleeve 10 is passed through completely by a through-bore 104 having an approximately substantially circular-cylindrical cross section.

Figure 2:
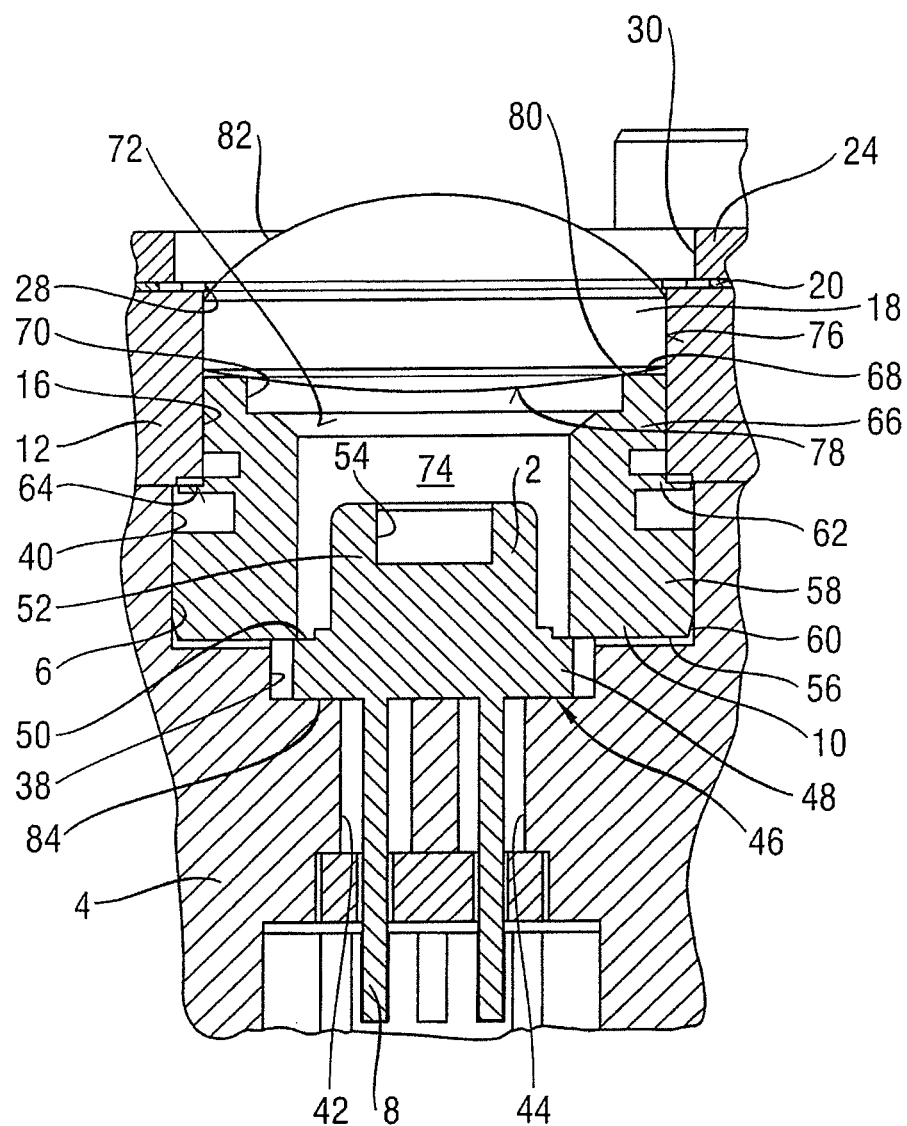
FIG. 2 shows a detail of the arrangement from FIG. 1 in a longitudinal section.
Figure 6:
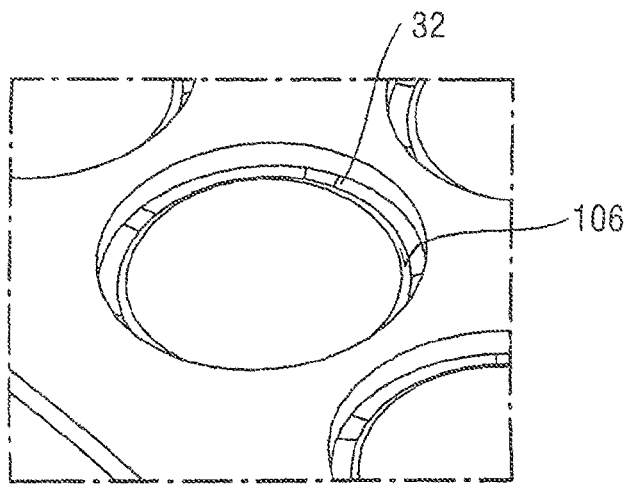
FIG. 6 shows a detail of the arrangement from FIG. 5 in the region of an optical element in a perspective view from above.

An upper side 104 of the lens 98 is configured in a way corresponding to the embodiment from FIG. 2 in the manner of a dome and convexly, but has an annular peripheral surface 106, extending approximately transversely in relation to the longitudinal axis, see also FIG. 6. In a way corresponding to FIG. 6, the spring projections 32 of the spring plate 20 act on this annular surface.

An arrangement with a multiplicity of semiconductor elements is disclosed. The semiconductor elements are respectively clamped against a semiconductor element carrier by way of a spring element. Additionally lying against the spring element is an optical element assigned to a respective semiconductor element, the spring element in this case being configured in such a way that it defines a fixed distance between the semiconductor element and the optical element.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An arrangement with at least one optical semiconductor element, which has a semiconductor housing fixed on a semiconductor element carrier, wherein the semiconductor housing is supported on the semiconductor element carrier and, for fixing, is loaded by way of a spring element with a spring force in the direction of the semiconductor element carrier, an optical element that is assigned to the semiconductor element being in operative connection with the spring element and the spring element being configured in such a way that it fixes a distance between the optical element and the semiconductor element, the spring element being formed as a spring sleeve, which lies with its one end face at least partly against the semiconductor housing and against the other end face of which the optical element assigned to the semiconductor element can be brought to lie at least partly, the spring sleeve being supported by way of a spring projection, extending radially away in the outward direction, and loading the semiconductor housing with the spring force.

2. The arrangement as claimed in claim 1, the spring element having a mechanically stiff element portion, for fixing the distance between the optical element and the semiconductor element, and a resilient element portion, with which the semiconductor housing is loaded with the spring force by way of the mechanically stiff element portion.

3. The arrangement as claimed in claim 1, a multiplicity of semiconductor elements being provided and semiconductor elements of at least a subset of all the semiconductor elements being respectively assigned an optical element, a respective optical element being secured on an element carrier connected to the semiconductor element carrier.

4. The arrangement as claimed in claim 3, the spring element being supported on the element carrier.

5. The arrangement as claimed in claim 1, the semiconductor element carrier having respectively for receiving the semiconductor element and the spring sleeve a clearance, which is partly covered over by the element carrier with a supporting surface, the spring element being supported on this surface by way of the spring projection.

6. The arrangement as claimed in claim 3, the element carrier having for receiving a respective optical element a through-opening.

7. The arrangement as claimed in claim 1, spring sleeves with different axial lengths being provided.

8. The arrangement as claimed in claim 1, a respective optical element being loaded by way of a further spring element with a spring force in the direction of the other spring element.

9. The arrangement as claimed in claim 8, the further spring element being formed as a spring plate, which has for a respective optical element a through-opening which extends around said element and into which there respectively extends at least one spring projection, which is formed on the spring plate and acts on the optical element.

10. The arrangement as claimed in claim 9, the spring plate being secured between the element carrier and a pressure-exerting plate, which is arranged on a large side of the element carrier that is facing away from the semiconductor element and has for each semiconductor element a through-opening.

11. An arrangement with at least one optical semiconductor element, which has a semiconductor housing fixed on a semiconductor element carrier, wherein the semiconductor housing is supported on the semiconductor element carrier and, for fixing, is loaded by way of a spring element with a spring force in the direction of the semiconductor element carrier, an optical element that is assigned to the semiconductor element being in operative connection with the spring element and the spring element being configured in such a way that it fixes a distance between the optical element and the semiconductor element, a respective optical element being loaded by way of a further spring element with a spring force in the direction of the other spring element, and the further spring element being formed as a spring plate, which has for a respective optical element a through-opening which extends around said element and into which there respectively extends at least one spring projection, which is formed on the spring plate and acts on the optical element.

12. The arrangement as claimed in claim 11, the spring plate being secured between the element carrier and a pressure-exerting plate, which is arranged on a large side of the element carrier that is facing away from the semiconductor element and has for each semiconductor element a through-opening.

* * * * *